United States Patent
Creighton, IV et al.

(10) Patent No.: US 6,677,752 B1
(45) Date of Patent: Jan. 13, 2004

(54) CLOSE-IN SHIELDING SYSTEM FOR MAGNETIC MEDICAL TREATMENT INSTRUMENTS

(75) Inventors: Francis M. Creighton, IV, St. Louis, MO (US); Gareth T. Munger, Richmond Heights, MO (US); Peter R. Werp, St. Louis, MO (US)

(73) Assignee: Stereotaxis, Inc., St. Louis, MO (US)

( * ) Notice: Subject to any disclaimer, the term of this patent is extended or adjusted under 35 U.S.C. 154(b) by 410 days.

(21) Appl. No.: 09/716,621

(22) Filed: Nov. 20, 2000

(51) Int. Cl.$^7$ .................................................. G01V 3/00
(52) U.S. Cl. ....................................... 324/318; 324/319
(58) Field of Search ................................ 324/318, 319, 324/320, 322, 300, 312, 314; 335/296, 301

(56) References Cited

U.S. PATENT DOCUMENTS

| | | | | |
|---|---|---|---|---|
| 4,646,046 A | * | 2/1987 | Vavrek et al. | 335/301 |
| 4,651,099 A | * | 3/1987 | Vinegar et al. | 324/320 |
| 5,001,448 A | * | 3/1991 | Srivastava et al. | 335/301 |

\* cited by examiner

*Primary Examiner*—Louis Arana
(74) *Attorney, Agent, or Firm*—Harness, Dickey & Pierce, P.L.C.

(57) ABSTRACT

A shield for controlling a magnetic field emanating from a magnetic in a magnetic medical treatment instrument has the form of a circular shaped band with opposite open ends and a center axis extending perpendicularly between the open ends. The magnet in the magnetic medical treatment instrument moves about an operating table having a surface upon which a patient being operated on by a physician reposes. The circular shaped shield surrounds the magnet and is spaced away from the magnet in a manner to allow the physician to enter the interior of the band and operate on the patient. The band has opposite first and second parallel planar portions. The top surface of the operating table and the first and second planar portions of the band are parallel to each other. The operating table has a length and a width, and the length of the operating table is parallel to the center axis of the band.

20 Claims, 6 Drawing Sheets

CLOSE-IN SHIELDING SYSTEM FOR MAGNETIC MEDICAL TREATMENT INSTRUMENTS

BACKGROUND OF THE INVENTION

1. Field of the Invention

This invention relates to magnetic shielding and in particular to passive magnetic shielding used to contain the fringe magnetic field emanating from a source magnet contained in a magnetic medical treatment instrument.

2. Description of the Related Art

Magnetic medical treatment instruments have long been used in the medical field as a tool in performing non-invasive medical procedures, stereotaxic mapping, and magnetic resonance imaging (MRI). The versatility for providing care with these types of instruments has increased with the advent of more powerful computers to assist the physician in controlling the magnet and processing the data developed by the treatment instrument. However, the fields and gradients created by the source magnets used by these treatment instruments are strong and usually require extensive shielding at many health care facilities.

In the environment of a health care facility, a magnetic field may cause interference with the proper operation of health care monitoring equipment and other electronic health aids. In areas where magnetic medical treatment instruments are used, advisory signs are generally posted to warn about the potential dangers of entering the area. Rooms housing magnetic medical treatment instruments or treatment rooms, have restricted access when the instrument is being used so that patients and other personnel using magnetically sensitive electronic equipment do not inadvertently enter the treatment room are become adversely effected from the operation of the instrument. Since space is at a premium in health care facilities, magnetic medical treatment instruments may be placed in rooms that are adjacent other areas where health care monitoring equipment and other electronic health aids are being used. To limit the areas in the health care facility having restricted access, the treatment room must be properly shielded. Some institutions and agencies impose limits as low as 5 Gauss on the field strength of magnetic fields outside the treatment room.

Conventional shielding systems in treatment rooms at health care facilities are rather elaborate and generally fixed in the structural portions and foundations of the treatment rooms. For example, the walls, the ceiling, and the floor of the treatment room may be lined with iron-based or other magnetic permeable materials in order to deflect and control the magnetic field generated by the source magnet. This shielding is extremely heavy, and may require additional structural support. Thus installation can be difficult, time consuming and expensive.

Often, conventional room shielding must be customized on the site once the magnetic medical equipment is installed to ensure proper attenuation of the magnetic field from the source magnet. These unexpected problems sometimes pose logistical problems for technicians during the initial set-up of the treatment instrument. Highly permeably magnetic materials are generally not easily machined and assembled on the job site. Congruent and matching shapes must be created between adjoining sections of shield to reduce the possibility of fringing the magnetic field.

A primary reason that room magnetic shielding is so heavy and complete is that it is used for MRI machines. These are generally hug cylindrical coils which are kept at a strong current continuously for months and years. Because of the size, the field wall (unless the new, compensating coils are used) is relatively strong. In addition, the size and direction of the field is constant, so that a strongly magnetized shielding, tending in part toward saturation at the wall, will take on a somewhat permanent magnetization of its own, with thermal variations and mechanical vibrations present to realign the magnetic domains more completely. It is observed when MRI machines are turned off that the wall shielding is quite highly magnetized. Unless such shielding is thick and of more expensive very low carbon steel, such a magnetization can be sever, even while maintaining safe levels outside the room, and will be insufficient to maintain safe levels outside after a period of use.

Therefore, in the Magnetic Stereotaxis System, or other strong magnetic field sources which take random directions in a procedure room, it is possible to judiciously design a system with much lighter, thinner, and less encompassing shielding.

Therefore, what is needed is a magnetic shield that guides and shapes the magnetic field emanating from the source magnet of a magnetic medical treatment instrument in such a manner as to attenuate the field in a relatively short distance away from the magnet. The shield would be arranged in close proximity to the magnet to contain the magnetic field around the magnet but still allow proper operation of the magnetic medical treatment instrument. By attenuating the field in a short distance away from the source magnet, rooms adjacent to the treatment room may have unrestricted access. The shield would allow other magnetic sensitive equipment found in rooms adjacent to the treatment room to be operated without interference. The magnetic shield would be standard equipment for a particular medical treatment instrument and obviate the requirement for custom placement and configuration of special shielding in the treatment room. The magnetic shield would be smaller and be of less weight so that the structural requirements of the treatment room may be reduced. The magnetic shield would have a lower cost than conventional methods of shielding the entire ceiling, floor, and walls of the treatment room.

SUMMARY OF THE INVENTION

According to the principals of the present invention, a magnetic shield is arranged in close proximity to the source magnet of a magnetic medical treatment instrument and forms an operating space within the volume defined by the shield. The magnetic shield shapes and channels the fringe magnetic field from the source magnetic to allow the magnetic medical treatment instrument to be operated in an environment where other magnetically sensitive electronic equipment may be used.

In one embodiment of the current invention, a magnetic shield is provided around a magnet medical device that generates magnetic fields to shape and channel the field so as to contain the magnetic field in the immediate vicinity of the magnet. Thus, the shield prevents the magnetic field from radiating from the treatment room into surrounding rooms which may have other sensitive electronic equipment that may be disturbed or disrupted by the magnetic field generated by the magnetic medical treatment instrument. The magnetic shield has a ceiling and opposite floor section, and left and right side sections extending between the ceiling and floor sections. The ceiling and floor sections and left and right sections of the shield define the operating space. The left and right side sections are curved members having concave surfaces facing toward each other that give the operating space a generally cylindrical shape. The magnetic reduced device is positional within the operating space.

According to another embodiment of the invention, the shield has the form of a tube with cylindrically shaped sides spaced apart by parallel, planar ceiling and floor sections. The tube has opposite open ends separated by the sides, and a center axis extending between the open ends. The tube has an interior defining an operating space in which the magnetic medical treatment instrument is placed. The operating space has sufficient area to allow a physician to enter and exit the operating space to operate on a patient with the magnetic medical treatment instrument.

According to another embodiment of the invention, a shield is used for controlling the magnetic field emanating from a magnetic medical device. The shield has the form of a circular shaped band having opposite open ends and a center axis extending perpendicularly between the open ends. The band is positioned to surround the magnet at distance from the magnet to allow the physician to enter the interior of the band and operate on the patient. The band has first and opposite, second parallel planar portions. The top surface of the operating table and first and second planar portions are parallel to each other.

In this arrangement the magnetic field emanating from the magnet used in the magnetic medical device may be shaped and contained with the immediate area of the magnet. By guiding the magnetic field in this way, the field may be directed out the open ends of the band into the surrounding room in selected directions. Because magnetic field falls off quickly with distance from the source, the magnetic field channeled out through the open ends of the shield may be dissipated in selected directions without the use of additional shielding in the walls of the treatment room. By providing the shield in close proximity to the source magnet, the magnetic field emanating from a magnetic medical device may be contained within the boundaries of the treatment room so that the operation of the magnetic medical device does not disrupt other electronic and other sensitive medical monitoring and treatment equipment in adjacent rooms. This also allows the construction of smaller treatment rooms. Additionally, by constructing a shield in close proximity to the source magnet, a smaller shield may be provided with a reduced weight and lower cost than room shielding.

In some cases a room is large enough, or a magnet source has small enough projected field, that shields on the ceiling and floor will suffice. In those cases, it is desirable to minimize their sizes and weights. This can optimally be done with appropriate consideration of the relative sizes and distances of these flat shields to that of the source magnet. Usually the floor plate is closer to the source magnet than is the ceiling plate. Therefore its design will need to incorporate greater thickness to reduce saturation, while it may be somewhat smaller in extent because it subtends a larger solid angle at the closer distance to the magnet. In essence, these plate provide regions which do not surround the source magnet, but which instead provide effective return paths for the flux at room boundaries that are closer than the side walls.

With the principle just stated, a finite element analysis (FEA) program can be used to provide specific design by trial and error. In this method, a first trial set of floor and ceiling plates is located in the FEA volume and a worst case magnetic source field applied. The resulting fields in regions beyond the plates and within the plates are calculated. From these the degree of saturation or lack of it in the plates is noted, and sizes and thickness of the plates adjusted accordingly, depending on the material used. A difficulty in this procedure occurs because the source field is so much stronger than the tolerable field outside the shields that sufficient resolution in space and field strength cannot be obtained in practical times with readily available computers. At this juncture in the procedure it is important to assess the field leakage around the plates along with the fields in the plates. If the leakage bulges sharply and significantly at the plate edges, then the plate is not overly saturated, but is too small, at least in one dimension. If the field drops across the plate, but is still too large beyond it, and there are not sharp bulges at the edge, then the plate is too thin, or of a material which saturates too easily, or is of too low permeability.

BRIEF DESCRIPTION OF THE DRAWINGS

Further objects and features of the invention are revealed in the following detailed description of the preferred embodiment of the invention and in the drawings wherein.

Corresponding reference characters indicate corresponding parts throughout the several views of the drawings.

DETAILED DESCRIPTION OF THE INVENTION

Figure 1:
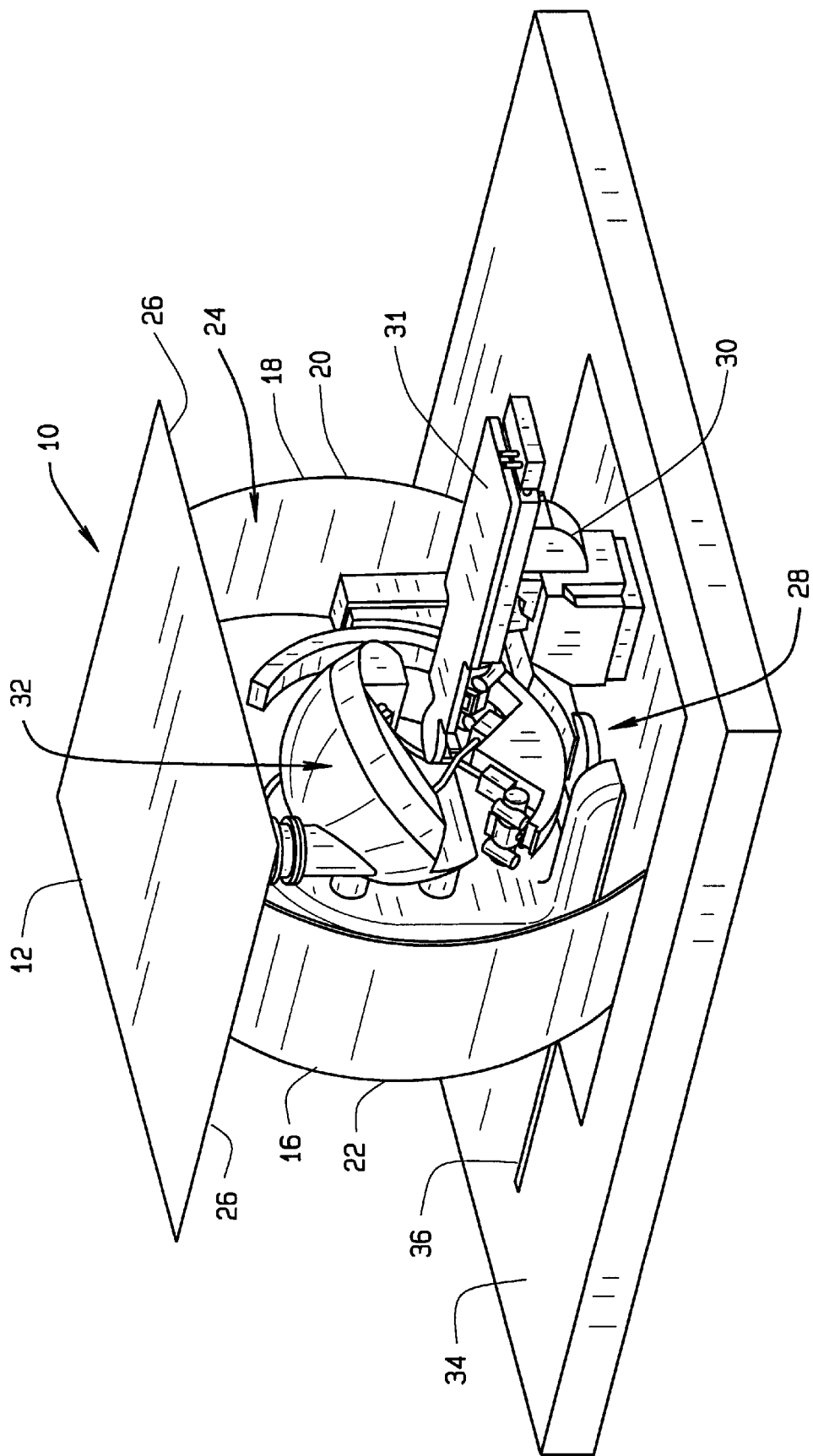
FIG. 1 is a perspective view of a magnetic medical treatment instrument of the present invention with a close-in magnetic shield system in place around the instrument.
Figure 2:
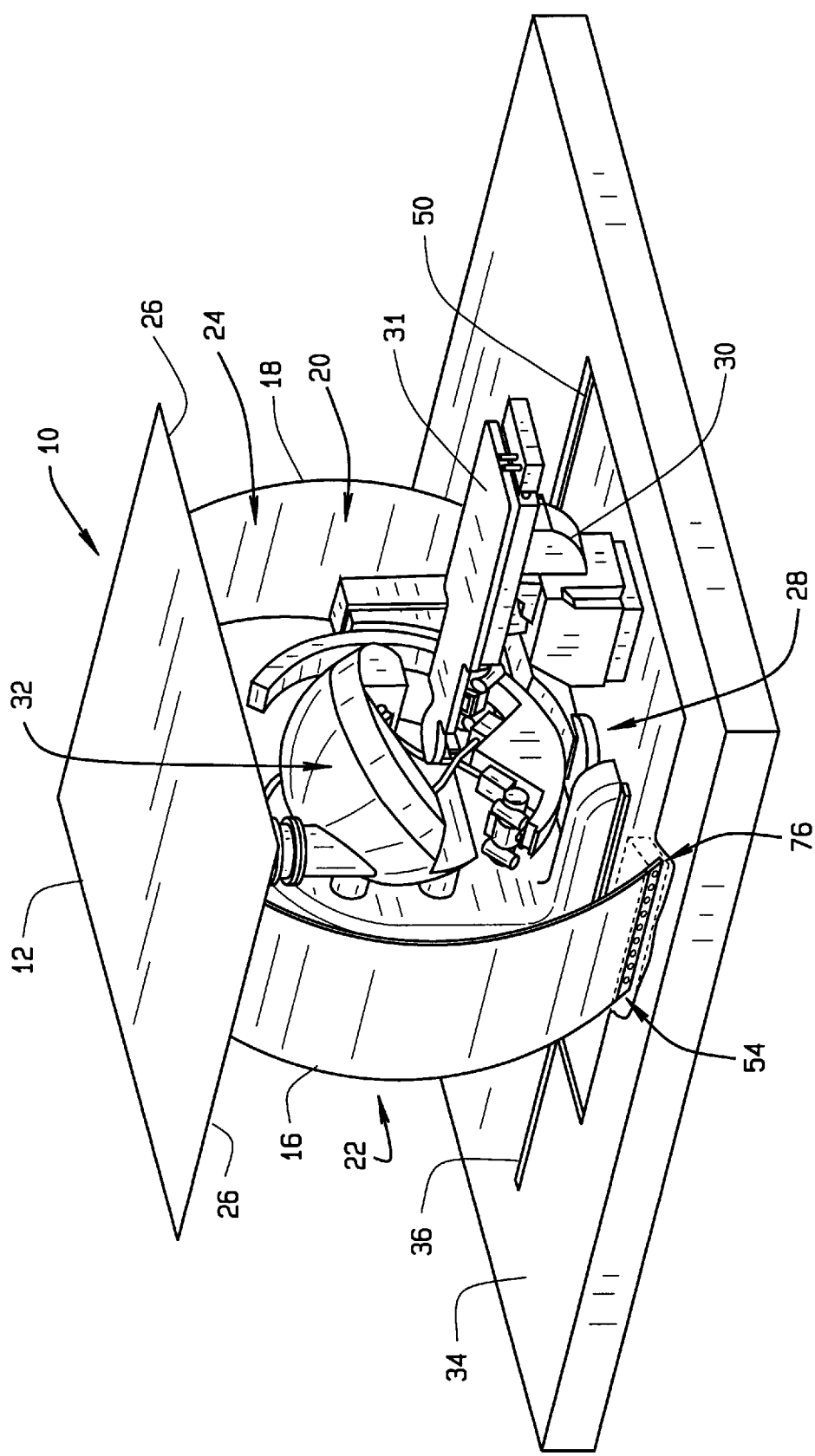
FIG. 2 is a perspective view of the magnetic shield of FIG. 1 with a cut-away view of a connection between a left section of the shield and a floor section of the shield.

FIGS. 1 and 2 show a general construction of a magnetic shield constructed according to the principles of the present invention. The magnetic shield, generally indicated at reference number 10, includes a ceiling section 12 and an opposite, floor section 14 spaced apart by a left and right side sections 16, 18. The ceiling section 12 and floor section 14 are preferably rectangular in shape and form parallel planes spaced apart from one another by the side sections 16, 18. The left and right side sections 16, 18 are curved members with concave surfaces facing each other that give the shield 10 a generally cylindrical appearance with opposite open ends 20, 22. Together, the ceiling and floor sections 12, 14, and the left and right side sections 16, 18 define the boundaries of an operating space 24. The operating space 24 has a center axis extending between the open ends 20, 22 that is aligned parallel with the axial direction of the cylindrically shaped shield 10 and the left and right side sections 16, 18 of the shield. Each of the ceiling and floor sections 12, 14 extend outward beyond the open ends 20, 22 of the operating space beyond the side edges of the left and right side sections 16, 18 in the direction of the center axis. Preferably, the ceiling section 12 extends outward beyond the left and right side sections 16, 18 in a direction perpendicular to the center axis to form an overhang 26 with each of the left and right side sections 16, 18.

A magnetic medical device 28 is positioned within the operating space 24. The magnetic medical device 28 includes a patient table 30 with a longitudinal axis that is aligned with the center axis of the operating space 24, and a source magnet 32. As shown in FIGS. 1 and 2, the floor 34 of the treatment room is equipped with a track 36 to allow the source magnet 32 to be positioned with respect to the patient table 30. In an alternative construction, the treatment instrument may have a patient table capable of moving into the operating space. The track 36 for the treatment instrument 28 is aligned parallel with the center axis of the operating space 24. The track 36 stops in a position where the source magnet 32 is fully encompassed by the left and right side sections 16, 18 when the source magnet 32 is properly positioned relative to the patient table 30.

Inside the operating space 24, the longitudinal axis of the patient table 30 is preferably positioned parallel with the center axis of the shield 10 as shown in FIGS. 1 and 2. A top surface 31 of the patient table 30 upon which the patient reposes during the procedure preferably forms a plane that is parallel with the ceiling and floor sections 12, 14 of the shield. Preferably, the patient table 30 is positioned such that the portion of the patient's body to be treated using the source magnet 32 is positioned within the travel range of the source magnet 32. A portion of the patient table 30 may extend through one of the open ends of the shield 10 so as to provide a more compact arrangement of the shield 10 around the patient table and the properly positioned source magnet 32.

Figure 3:
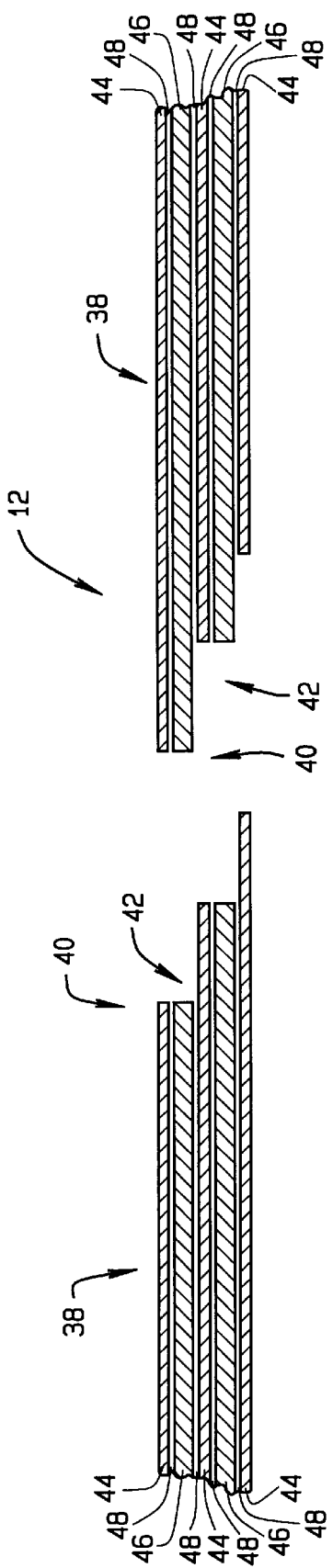
FIG. 3 is a cross-sectional view of a joint in a section of the magnetic shield of FIG. 1.

The ceiling and floor sections 14, 16 may be formed from smaller modules 38 to reduce the overall weight and cost of manufacturing the sections of shield 10. Preferably, the ceiling and floor sections 14, 16 are made from three modules 38 and each of the left and right side sections 16, 18 are made from a single module 38. Each module 38 is preferably an industry standard size of 4'x8' flat stock material. As shown in FIG. 3, each module to be joined to form a section has a joint edge 40 with steps 42. The steps 42 allow the modules 38 to be joined with an overlap that forms a smooth interlocking surface between adjacent modules 38 of the sections. The outer most corners of the modules may have fastener holes to secure adjacent modules. The left and right side sections 16, 18 of the shield are preferably rolled to form the desired radius of curvature to generate the needed volume in the operating space 24.

Figure 4:
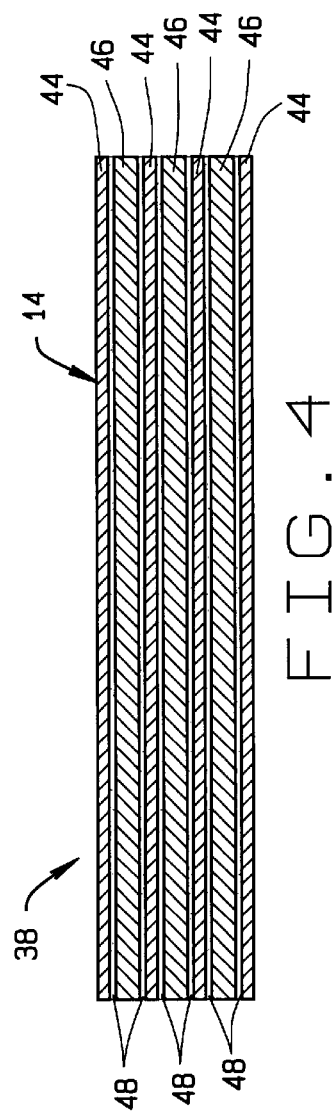
FIG. 4 is a partial, side cross-sectional view of a typical portion of the magnetic shield used to form a floor section of the magnetic shield of FIG. 1.
Figure 5:
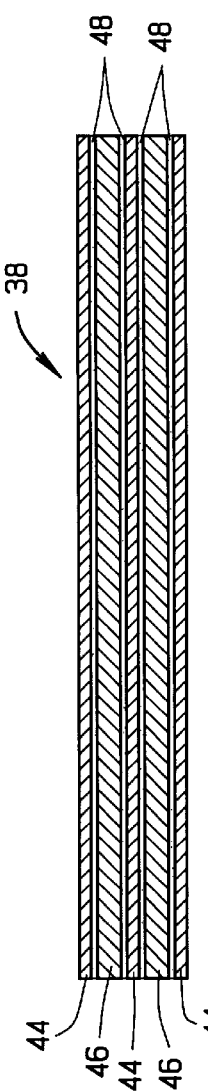
FIG. 5 is a partial, side cross-sectional view of a typical portion of the magnetic shield used to form ceiling, left, and right sections of the magnetic shield of FIG. 1.

As shown in FIGS. 3, 4 and 5, the modules 38 are preferably made from layers of carbon steel 44 and aluminum 46. Experimentally, it has been found that a laminate of AISI 1008 steel and aluminum (any grade) provide adequate materials for the shield. The carbon steel 44 is a magnetically permeable material and the aluminum 46 decreases the overall weight of the module 38. Preferably, each layer of the carbon steel 44 is 1/32" thick and each layer of the aluminum 46 is 1/16" thick. The floor section 14 of the magnetic shield 10 is comprised of four layers of carbon steel 44 interposed among three layers of aluminum 46, as shown in FIG. 4. The ceiling section 12, and left and right side sections 16, 18 of the magnetic shield have a similar construction except that the laminate is comprised of three alternating layers of carbon steel interposed among two layers of aluminum, as shown in FIG. 5. To bond the carbon steel 44 to the aluminum 46, an adhesive 48 is used. Preferably, the adhesive 48 is sprayed on and has a thickness of no more than 0.010" to promote adequate field conduction.

The ceiling section 12 of the magnetic shield is preferably held in position above the operating space 24 by attaching it to a structure of the room in which the magnetic medical treatment instrument 28 is to be used. The ceiling section 12 is suspended from the structural members that comprise the ceiling structure between adjacent floors in the building. The ceiling section 12 is rectangular in shape and extends beyond the operating space 24 to overhang the patient table 30 at one open end 20 of the operating space 24 and to overhang the magnetic medical treatment instrument 28 as it travels along its tracks 36 adjacent the opposite open end 22 of the operating space 24.

Spaced away and parallel to the ceiling section 12 is the floor section 14. In a similar arrangement with the ceiling section 12, the floor section 14 preferably extends beyond the operating space 24 in the directions of the open ends 20, 22 of the operating space 24 along the center axis of the operating space 24. The floor section 14 may project the same distance as the ceiling section 12 beyond the open ends 20, 22 of the operating space 24 in the same direction as the center axis of the operating space 24. As shown in FIG. 2, the floor 34 of the treatment room is preferably formed with a rectangular recess 50 having a length and width equal to the floor section 14 of the magnetic shield 10 so that the recess 50 may receive the floor section 14 therein. The depth of the recess 50 is sized for the thickness of the floor section 14 and to accommodate the height of the tracks 36 upon which the source magnet or patient table slides. The side perimeter edges of the floor shield 14 operably connect to the left and right side sections 16, 18 of the shield 10 and do not extend beyond the left and right sections 16, 18.

The left and right side sections 16, 18 of the shield are concave members that are shaped to increase the volume of the operating space 24. The radius of curvature generally is proportional to the shape of the magnet field emanating from the source magnet 32 so as to contain the flux emanating from the magnet 32. The curvature is also arranged so that a smooth transition may be provided between the left and right side sections 16, 18 and each of the ceiling and floor sections 12, 14 of the shield. The left and right side sections 16, 18 are positioned so that when the magnet 32 is properly positioned with respect to the patient table 30, the left and right side sections 16, 18 fully encompass the source magnet 32. The left and right side sections 16, 18 are also spaced away from the source magnet 32 to allow the physician to enter the operating space 24 and operate on a patient on the patient table 30. The left and right side sections 16, 18 are spaced sufficiently away from the patient table 30 to allow the physician to enter and exit the operating space 24 and access the control panels and other instrumentation that are used to control the treatment instrument 28. Since the ceiling and floor sections 12, 14 are permanently affixed to the structures of the treatment room, the left and right side sections 16, 18 do not bear the weight of the ceiling section 12. The left and right side sections 16, 18 of the magnetic shield 10 are constructed to support each section's 16, 18 respective own weight while the curvature provides ample room in the operating space 24.

The left and right side sections 16, 18 of the shield act as a flux connector between the ceiling and floor sections 12, 14 of the shield. In order to guide the field between each of the side sections 16, 18 and the floor and ceiling sections 12, 14 without causing the field to fringe, a smooth transition between the sections is needed. To provide the smooth transition between the left and right side shields 16, 18 and the ceiling and floor sections 12, 14 of the magnetic shield, ceiling and floor angle plates 52, 54 are provided.

Figure 6:
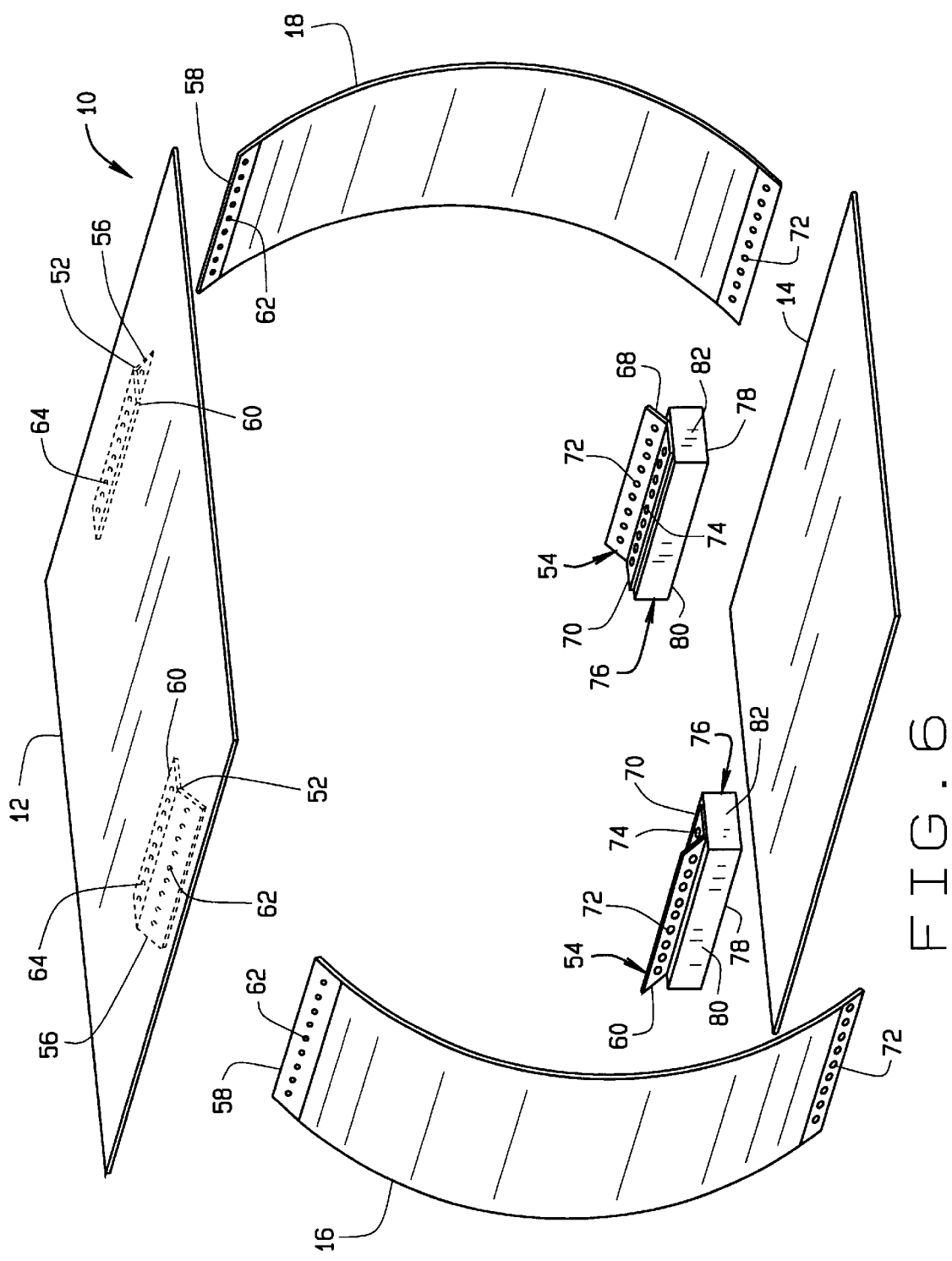
FIG. 6 is an exploded, perspective view of the magnetic shield of FIG. 1.
Figure 7:
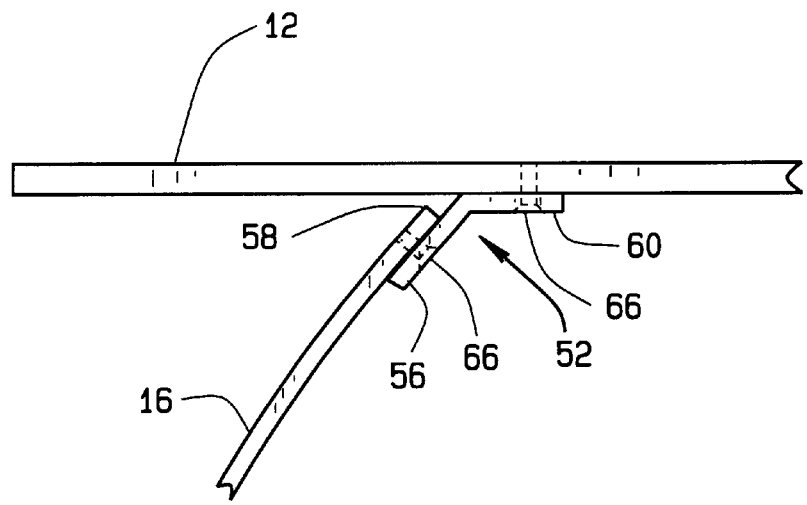
FIG. 7 is a partial, side view of the connection between the ceiling section of the shield and the left side section of the magnetic shield of FIG. 1.

As shown in FIG. 6, two ceiling angle plates 52 are provided to join the left and right side sections to the ceiling section 12, and two floor angle plates 54 are provided to join the left and right side sections 16, 18 to the floor section 14 of the shield. Preferably, the angle plates 52, 54 have the same width as the left and right side sections 16, 18. The ceiling angle plates 52 have a side engagement portion 56 that attaches a top edge 58 of the each of the left and right side sections 16, 18 of the shield, and a ceiling engagement portion 60 that is obliquely angled to the side engagement portion 56. The top edge 58 of each of the left and right side sections 16, 18 and the side engagement portion 56 of the ceiling angle plates 52 have a series of matching fastening holes 62 that permit attachment of each of the side sections 16, 18 to the respective ceiling angle plate 52 to the ceiling section 12 of the shield. As shown in FIG. 7, the oblique angle at which the ceiling engagement portion 60 is formed with the side engagement portion 56 provides a smooth transition between the left and right side sections 16, 18 and the ceiling section 12. The angle plate 52 may have a thickness that allows mechanical fasteners 66 to be countersunk into the ceiling angle plate 52 so as to prevent a fringing field to be developed from sharp protrusions that may extend beyond the interior surfaces of the shield.

To join the left and right side sections 16, 18 of the shield to the floor section 14, the floor angle plates 54 are provided. The floor angle plates 54 have a similar construction to the ceiling angle plates 52 in that the floor angle plates 54 have a side engagement portion 68 that attaches to the left and right side sections 16, 18 of the magnetic shield and a floor shield engagement portion 70 which engages and attaches to the floor section 14. The side engagement portion 68 of the floor angle plate 54 and the bottom portion of each of the left and right side sections 16, 18 have a series of matching holes 72. In this way, each left and right side section 16, 18 may be attached to the respective floor angle plate 54. Preferably, the mechanical fasteners 66 are used to join the left and right side sections 16, 18 to the floor angle plate 54. The side engagement portion 68 is obliquely angled to the floor engagement portion 70. The floor engagement portion 70 also has a series of holes through it along its width 74 for attaching the floor angle plate 54 to the floor section 14.

Figure 8:
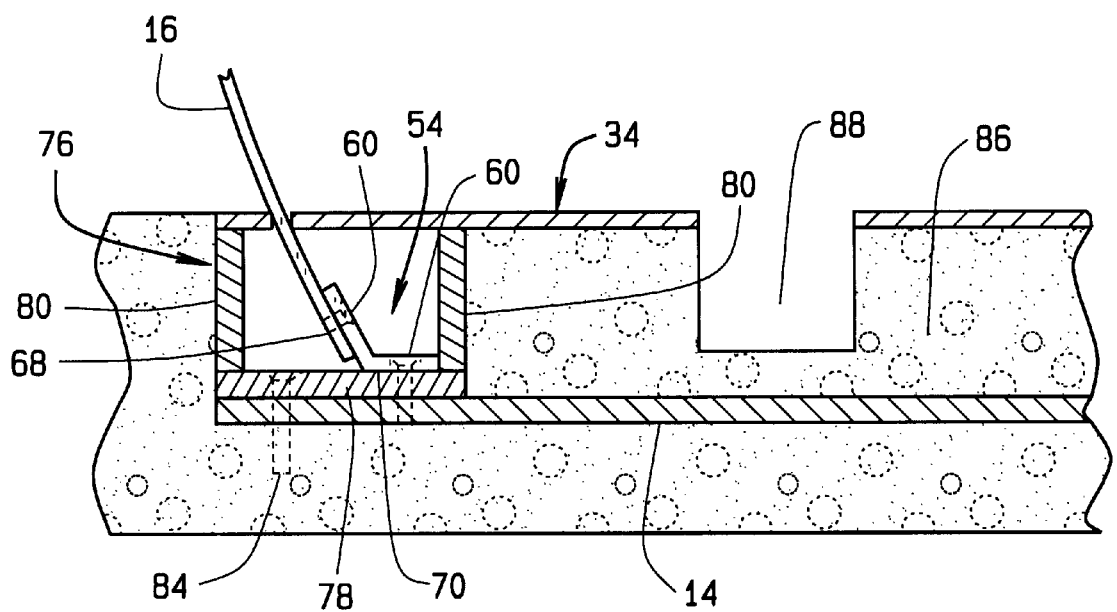
FIG. 8 is a partial, side cross-sectional view of the connection between the floor section of the shield and left side section of the magnetic shield of FIG. 1.

On the side perimeter edges of the floor section 14 in the area where the left and right side sections 16, 18 are joined to the floor section 14, a floor box 76 is provided. As shown in FIG. 6, each floor box 76 is rectangular in shape with four walls extending outward from a bottom wall 78 to form a rectangular box with an open top. The floor box 76 has side walls 80 that are slightly wider than the width of the left and right side sections 16, 18 of the shield, and end walls 82 that are wider than the combined size of the side engagement portion 68 and the floor engagement portion 70 of the floor angle plate 54. As shown in FIG. 8, the interior volume of the floor box 76 is sized to receive the floor angle plate 54 and the bottom portion of the respective left and right side section 16, 18. The bottom wall 78 of the floor box 76 is positioned on top of the floor section 14 to expose the open top. The side perimeter edge of the floor section 14 is substantially even with the outboard side wall 80 of the floor box 76. The floor box 76 is anchored to the floor 34 of the treatment room through a floor box anchor 84. The floor box anchor 84 also partially secures the floor section 14 to the floor 34 of the room.

FIGS. 2 and 8 show the typical arrangement of the floor box 76 and floor section 14. The walls 78, 82 of the floor box 76 extend upward from the bottom wall 78 of the floor box 76 to enclose the floor angle plate 54 and provide a bounded volume in which the left and right side sections 16, 18 of the shield may be joined to the floor section 14. The walls 78, 82 of the floor block 76 are spaced away from the surfaces of the floor angle plate 54 to provide an installation technician access to the mechanical fasteners 66 that attach the left and right side sections 16, 18 of the magnetic shield to the side engagement portion 68 of the floor angle plate 54 and access to the mechanical fasteners 66 that attach the floor engagement portion 70 of the angle plate to the floor section 14.

Generally, a portion of the magnetic medical treatment instrument 28 slides on a track 36 that is positioned in the floor 34 of the treatment room. To ensure that the magnetic flux emanating from the source magnet 32 of the magnetic medical instrument 28 is properly controlled and shaped, the floor section 14 of the shield is positioned under the tracks 36, as shown in FIG. 8. However, to support the weight of the sliding portions of the treatment instrument 28, the tracks 36 are positioned on a layer of concrete 86 poured on top of the floor section 14 of shield. When the concrete is poured over the floor section 14 of the shield and trenches 88 for the tracks 36 are formed, the floor boxes 76 provide a mold around the fasteners 66 and floor angle plate 54 to provide access to the floor angle plate 54 and the fasteners 66. The floor box 76 acts a flux connector to direct the magnetic field from the left and right side sections 16, 18 to the floor 14 where the concrete layer 86 in the floor 34 might otherwise impede the travel of the field. Preferably, the floor blocks 76 and floor angle plates 54 are made from carbon steel or other highly magnetic permeable material to allow the magnetic field to be conducted from the ceiling section 12 to the floor section 14 of the shield.

Figure 9:
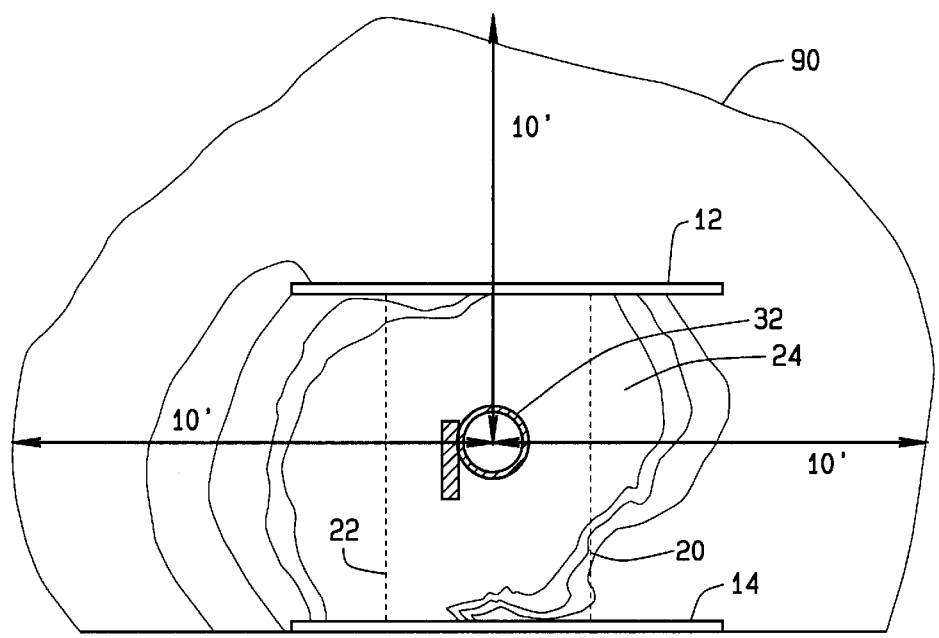
FIG. 9 is a side view of the magnetic shield of FIG. 1 showing the magnetic field distribution from the side of the shield.
Figure 10:
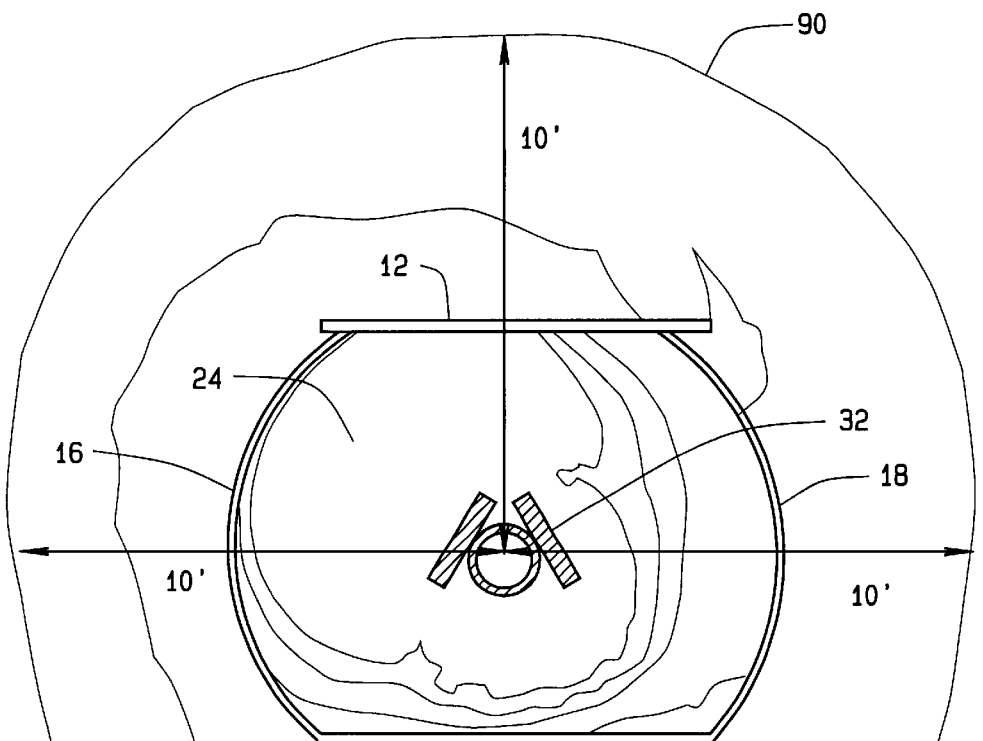
FIG. 10 is a front view of the magnetic shield of FIG. 1 showing the magnetic field distribution from the front of the shield.

FIGS. 9 and 10 provide a visual representation of the attenuation of the magnetic field using the shield 10 of the present invention. In operation, the shield 10 attenuates a magnetic field having a field strength of 0.1 Tesla to less than 5 Gauss at a distance of approximately ten feet from the top surface of the operating table in each vertical direction. The 5 Gauss line is indicated at reference numeral 90. Similarly, the shield 10 attenuates the field to less than 5 Gauss at a distance of ten feet from the centerline of the patient table in each horizontal direction. The shield directs the magnetic field out through the open ends 20, 22 of the operating space 24 where air acts to attenuate the magnetic field. As shown in FIGS. 9 and 10, the field is also attenuated to less than 5 Gauss at a distance of approximately ten feet in both directions through the open ends 20, 22 of the shield 10.

Thus, with the magnetic shield 10 of the present invention, the magnetic medical treatment instrument 28 may be positioned in any room in the hospital and an adjacent room may have unrestricted use. Although the patient table 30 extends upward from the floor 36 of the treatment room a height of roughly four feet, the distance between the rooms on floors below and above the treatment room is such that the 5 Gauss line 90 does not generally extend into these areas. Thus, rooms on floors below and above the treatment room may also be released for unrestricted use given the shield and source magnet described previously.

The ceiling angle plate 52 and the floor angle plate 54 provide smooth transitions to guide and shape the flux between the ceiling and floor sections 12, 14. Since the shield 10 is arranged in close proximity to source magnet 32, the size and resultant weight of the shield 10 may be reduced. This reduces the material and cost of the shield 10. Moreover, because the shield is relatively thin and has a reduced weight, the shield may be easy installed and retrofitted into existing treatment rooms. Although the magnetic shield 10 of the present invention is formed using alternating layers of carbon steel 44 and aluminum 46, other highly magnetic permeable materials such as 80 Ni metal may be used to form the shield 10. Carbon steel 44 has been chosen because of its relative cost effectiveness, its each of machining and manufacturing, its bonding capabilities with other metals, and its ease of forming into required shapes.

As various changes could be made in the above construction with departing from the scope of the invention, it is intended that all matter contain the above description and shown in the accompanying drawings shall be interpreted as illustrative and not in any limiting sense. The invention therefore shall be solely limited by the scope of the claims set forth below.

What is claimed is:

1. A shield for shielding the magnetic field produced by a magnetic medical device which includes a magnet, the shield surrounding the magnetic medical device and having opposite ceiling and floor sections and opposite left and right sections extending between the ceiling and floor section, the ceiling, floor, left and right sections defining an operating space, the floor section being at a different distance from the magnet than the ceiling section.

2. The shield of claim 1 wherein the sections are formed from layers of aluminum and steel.

3. The shield of claim 2 wherein the layers of aluminum and steel are bonded together with adhesive to form a rigid laminate member.

4. The shield of claim 1 wherein:
the ceiling and floor sections of each define a plane, the left and right sections each have a top edge abutting the ceiling section and a bottom edge abutting the floor section, the top and bottom edges of each of the left and right section are contained entirely within the plane of both the ceiling and floor sections.

5. The shield of claim 1 wherein:
the left and right sections have a top edge abutting the ceiling section and a bottom edge abutting the floor section, the top and bottom edges of the left and right sections form smooth transitions in the operating space between the left and right sections and the ceiling and floor sections.

6. The shield of claim 1 wherein the ceiling section extend outward beyond the left and right side sections to form overhang.

7. The shield of claim 1 wherein:
each of the left and right sections have a bottom edge adjacent the floor section and a floor angle plate attached to each of the bottom edges of the left and right sections, the floor angle plate joins each of the left and right sections to the floor section, the floor angle plate provides a smooth transition from each of the left and right sections to the floor section.

8. The shield of claim 7 wherein:
the floor section includes a floor box with four walls extending upward from the floor section on a side perimeter edge of the floor section, each of the four walls of the floor box surrounds the angle plate and entirely contains the floor angle plate within the floor box.

9. The shield of claim 1 wherein the operating space has the form of a tube having opposite open ends spaced apart by the left and right side sections and a center axis between the open ends.

10. A shield for shielding a magnetic field generated by a magnetic medical device which includes a magnet, the shield comprising:
a tube having cylindrically shaped sides spaced apart by opposite planar ceiling and floor panels, the floor panel being at a different distance from the magnet than the ceiling panel, the tube having opposite open ends separated by the sides and a center axis extending between the open ends, the tube having an interior surface defining an operating volume in which the magnetic medical treatment instrument is placed, the operating volume having sufficient space to allow a physician to enter and exit the operating volume through one of the open ends of the tube and operate the magnetic medical device.

11. The shield of claim 10 wherein the magnetic medical treatment instrument includes an operating table having a length and a width, and the length of the table is parallel to the center axis.

12. The shield of claim 10 wherein the cylindrically shaped sides smoothly transition to the planar ceiling and floor panels on the interior of the tube.

13. The shield of claim 10 wherein:
each of the left and right sections have a bottom edge adjacent the floor section and a floor angle plate attached to each of the bottom edges of the left and right sections, the floor angle plate joins each of the left and right sections to the floor section, the floor angle plate provides a smooth transition from each of the left and right sections to the floor section.

14. The shield of claim 13 wherein:
the floor section includes a floor box with four walls extending upward from the floor section on a side perimeter edge of the floor section, each of the four walls of the floor box surrounds the angle plate and entirely contains the floor angle plate within the floor box.

15. The shield of claim 10 wherein the planar ceiling and panel extends outward from the operating volume and overhangs the cylindrically shaped sides.

16. The shield of claim 10 wherein the magnetic field emanating from the magnetic medical treatment instrument is guided by the cylindrically shaped sides through the open ends of the tube.

17. A shield for controlling the magnetic field emanating from a magnetic medical device wherein the magnetic medical device has a magnet that produces the magnetic field, the magnet moves about an operating table having a top surface upon which a patient reposes while being operated on by a physician, the shield comprising:

a circular shaped band having opposite open ends and a center axis extending perpendicularly between the open ends, the band being circumsuperjacent the magnet in a manner to allow the physician to enter an interior of the band and operate on the patient, the band having opposite first and second parallel planar portions, the top surface of the operating table and the first and second planar portions being parallel to each other, the operating table having a length and a width and the length being parallel to the center axis of the band, and the first planar position being closer to the magnet than the second planar position.

18. The shield of claim 17 wherein the first and second planar portions extend outward and away from the band.

19. The shield of claim 17 wherein the first and second planar portions have opposing faces that are smoothly formed in the interior of the band.

20. A method of designing a shield for a magnetic medical device which includes a source magnet, the shield comprised of a floor plate and a ceiling plate, the method comprising:
   a) balancing the size of the two plates according to their solid angle subtended at the source magnet;
   b) balancing the thickness of the two plates according to their solid angle subtended at the source magnet, in combination with appropriate materials;
   c) choosing the size of the plates according to their effectiveness in controlling the flux lines beyond them, as attested by the pattern of the flux leakage around them; and
   d) using an iterative design procedure employing a finite element analysis program.

* * * * *